(12) United States Patent
Ju

(10) Patent No.: US 7,043,832 B2
(45) Date of Patent: May 16, 2006

(54) MANUFACTURING METHOD FOR FIXING TIN BALLS IN CONNECTORS OR IC DEVICES

(76) Inventor: Ted Ju, No. 15, Wu Shiunn St., An Leh District, Keelung City (TW)

(*) Notice: Subject to any disclaimer, the term of this patent is extended or adjusted under 35 U.S.C. 154(b) by 428 days.

(21) Appl. No.: 10/295,991

(22) Filed: Nov. 18, 2002

(65) Prior Publication Data

US 2004/0093724 A1   May 20, 2004

(51) Int. Cl.
*H01K 3/10* (2006.01)

(52) U.S. Cl. .............. 29/852; 29/840; 29/832; 29/843

(58) Field of Classification Search .......... 29/840, 29/846, 852, 832, 843
See application file for complete search history.

(56) References Cited

U.S. PATENT DOCUMENTS 5,480,835 A * 1/1996 Carney et al. .............. 438/614

* cited by examiner

*Primary Examiner*—Richard Chang
(74) *Attorney, Agent, or Firm*—Bacon & Thomas, PLLC

(57) ABSTRACT

A method for fixing tin balls in one of a connector or an IC device to the welding portion of the terminals of an electric connector, IC or other electronic element so that the terminal can be welded to the tin balls of the ball grid array seat includes the steps of: selecting a ball grid array seat; covering a bottom of the ball grid array seat by a mold plate having a plurality of recesses; filling the tin glue into the recesses of the mold plate so that the tin glue exactly encloses the welding portions of the terminals; taking out the mold plate; and melting the tin glue so as to condense the tin glue into balls or ball-like tin balls, so that the condensed tin balls are combined with the welding portions. The mold plate is optional and maybe omitted in favor of directly filling the tin glue into recesses in the ball grid array seat.

4 Claims, 5 Drawing Sheets

MANUFACTURING METHOD FOR FIXING TIN BALLS IN CONNECTORS OR IC DEVICES

BACKGROUND OF THE INVENTION (a) Field of the Invention

The present invention relates to tin balls of a ball grid array seat, and particularly to a manufacturing method for fixing tin balls in one of a connector or an IC device.

(b) Description of the Prior Art

Conventionally, electric connectors, CPUs, chips, zero insertion electric connector or electric elements are welded to a circuit board. A plurality of terminals embedding holes are punched on a circuit board for embedding a plurality of terminals. Then the terminals are welded and fixed by tin material. This way is not preferred for terminals with a larger number of pins and with slender pins. Therefore, it is not adapted in the current electronic technology. To improve the defects in the prior art, the bottom of the terminals are combined with tin balls which are then welded to a circuit board.

However, the tin balls are adhered to a circuit board by various ways, for example, the welding portion of a terminal is formed with two copper clips or, as shown in FIGS. 10 and 11, the welding portion 101 of a terminal 10 is formed as a plane and welding assisting agent 102 is used in welding (referring to FIG. 12). Therefore, the manufacturer must prepare several producing lines for these tedious works so that the costs in manufacturing and repair are high. Moreover, the forms of the terminals are fixed and cannot be designed as desired.

For the manufacturing method that the plane welding portion of the a terminal 10 is combined with melted tin ball 20 using a welding assisting agent (referring to FIG. 10 and 11), the welding portion 101 of the terminal 10 has a plane structure so that the welding assisting agent can be printed upon the welding portion 101. If the welding portion has a needle shape or an embedded shape, the welding portion is not suitable for printing the welding assistant agent. Therefore, the prior art is not a preferred way and cannot be used in various terminal structures.

SUMMARY OF THE INVENTION

A primary object of the present invention is to provide a method for fixing tin balls in one of a connector or an IC device to the welding portion of the terminals of an electric connector, IC or other electronic element so that the terminal can be welded to the tin balls of the ball grid array seat; the method comprising the steps of: (a) selecting a ball grid array seat, including internal embedded terminals, a bottom of each terminal having a terminal welding portion; (b) covering a bottom of the ball grid array seat by a mold plate having a plurality of recesses aligned with respect to the welding portions of the terminals; (c) filling tin glue into the recesses of the mold plate so that the tin glue exactly encloses the welding portions of the terminals; (d) taking out the mold plate so that the tin glue is left in the welding portions of the terminals; and (e) melting the tin glue so as to condense the tin glue into balls or ball-like tin balls, so that the condensed tin balls are combined with the welding portions at the lower ends of the terminals of the ball grid array seat.

Another object of the present invention is to provide a method for fixing tin balls in one of a connector or an IC device to the welding portion of the terminals of an electric connector, IC or other electronic element so that the terminal can be welded to the tin balls of the ball grid array seat; the method comprising the steps of: (a) selecting a ball grid array seat, including internal embedded terminals, a bottom of each terminal having a terminal welding portion; (b) filling tin glue into the recesses in the ball grid array seat so that the tin glue exactly encloses the welding portions of the terminals; and (c) melting the tin glue so as to condense the tin glue into balls or ball-like tin balls, so that the condensed tin balls are combined with the welding portions at the lower ends of the terminals of the ball grid array seat.

The various objects and advantages of the present invention will be more readily understood from the following detailed description when read in conjunction with the appended drawing.

DETAILED DESCRIPTION OF THE PREFERRED EMBODIMENTS

Figure 1:
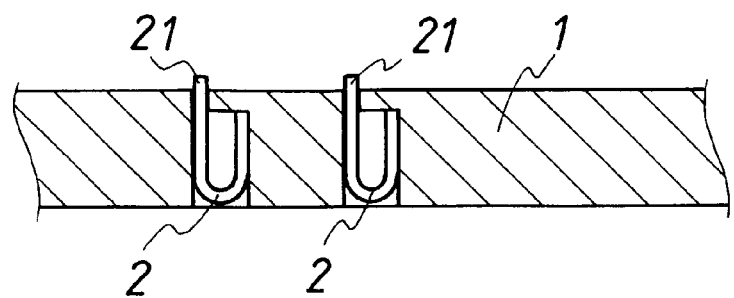
FIG. 1 is a schematic view about the ball grid array seat and the terminals of the present invention.
Figure 2:
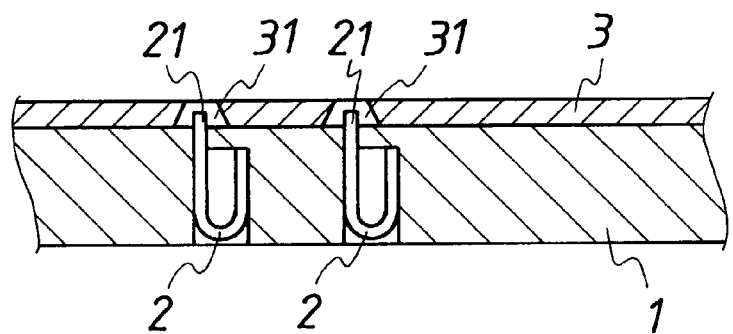
FIG. 2 is a schematic view showing that the use of the mold plate in the present invention.

Referring to the Figures, the electric connector and IC tin ball fixing manufacturing method of the present invention is illustrated. The present invention can be used for the welding portions of the terminals of an electric connector, IC or other electronic element so that the terminals can be welded to the tin balls of the ball grid array seat 1. The manufacturing method will be described herein:

(a) Select a ball grid array seat 1 (referring to FIG. 1) in which the interior of the ball grid array seat 1 has been embedded with terminals 2 and the bottom thereof has a terminal welding portion 21. The ball grid array seat 1 can be the bottom component of one of an electric connector, IC or other electronic elements.

A bottom of the ball grid array seat is covered by a mold plate 3 having a plurality of recesses 31. The mold plate 3 is formed with respect to the welding portion 21 of the terminal 2.

Figure 3A:
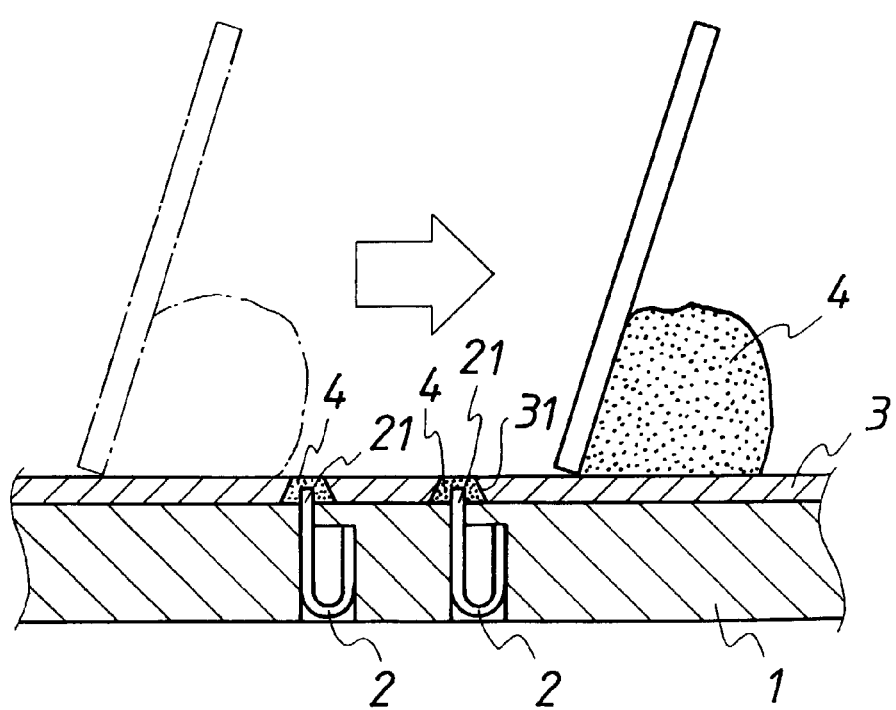
FIG. 3A is a schematic view showing the tin glue being coated in the recesses according to present invention.
Figure 3B:
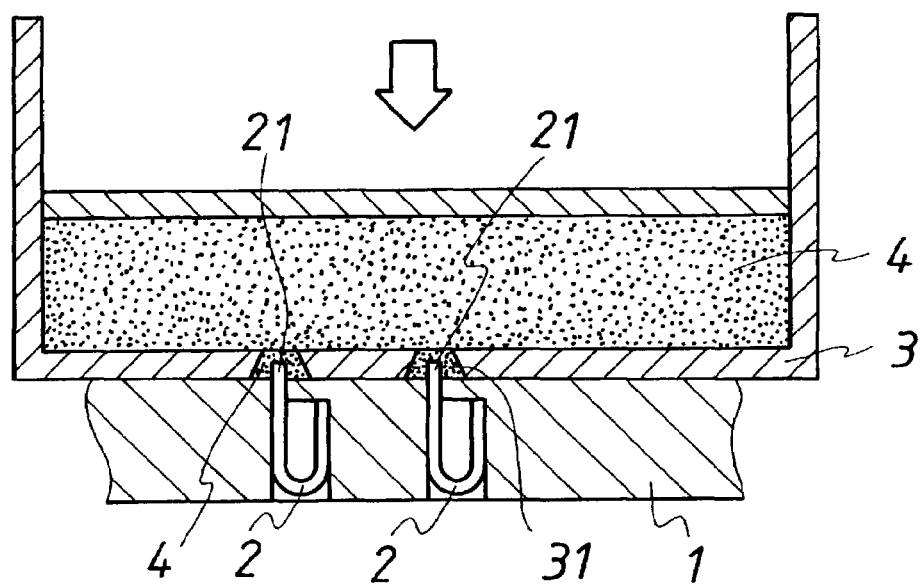
FIG. 3B is a schematic view showing the tin glue being extruded into the recesses according to the present invention.
Figure 3C:
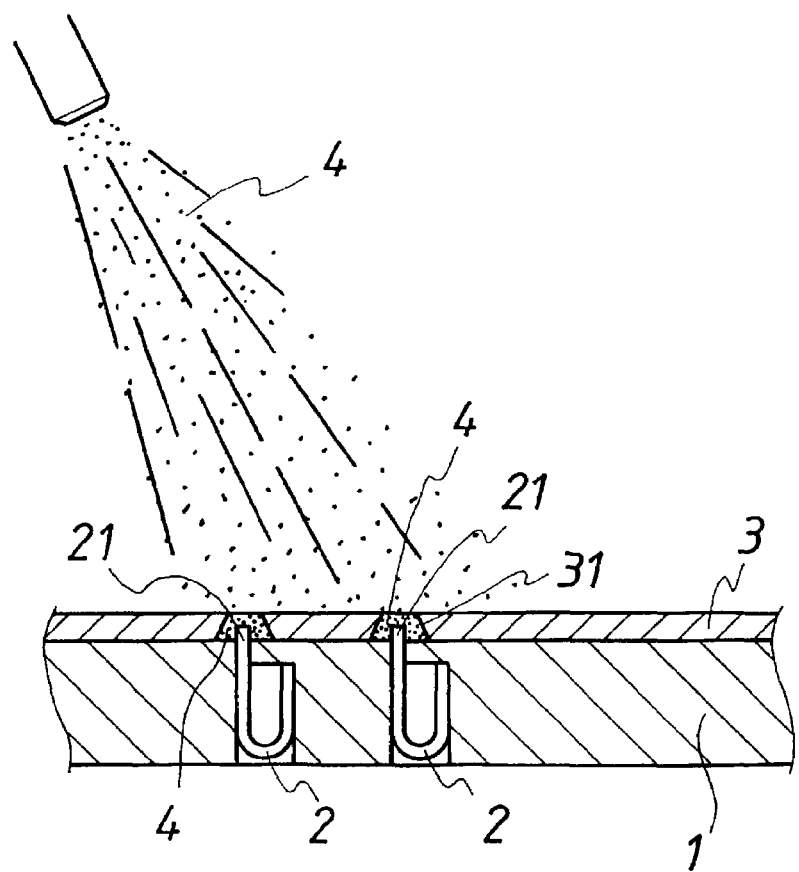
FIG. 3C is a schematic view showing the tin glue being injected into the recesses according to the present invention.

(c) The tin glue 4 is filled into the recesses 31 of the mold plate 3 so that the tin glue 4 exactly encloses the welding portions 21 of the terminals 2; the tin glue 4 is coated upon the recesses 31 of the mold plate 3 (referring to FIG. 3A), or the tin glue 4 is extruded into the recesses 31 of the mold plate 3 (referring to FIG. 3B); or the tin glue 4 is injected into the recesses 31 of the mold plate 3 (referring to FIG. 3B).

Figure 4:
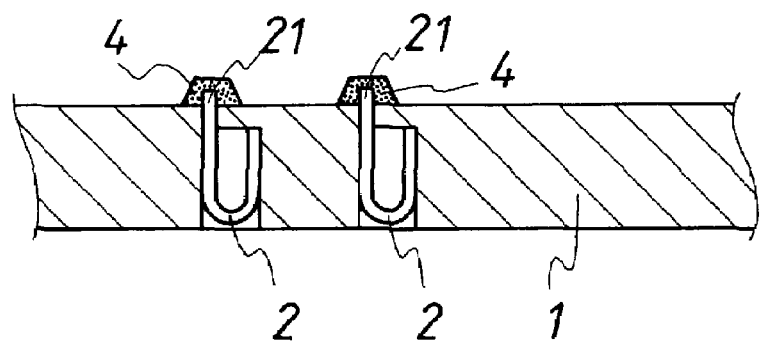
FIG. 4 is a schematic view showing the tin glue of the present invention in that the mold plate is taken down.

(d) The mold plate 3 is taken out so that the tin glue 4 is left in the welding portions 21 of the terminals 2 (referring to FIG. 4).

Figure 5:
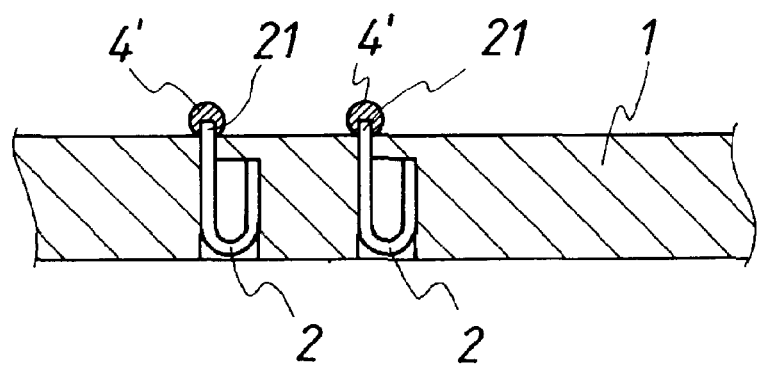
FIG. 5 is a schematic view showing that in the present invention, the tin glue is melt.
Figure 6:
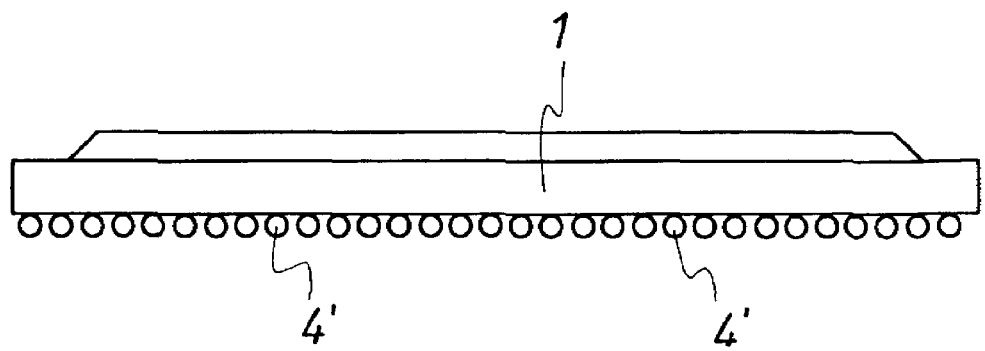
FIG. 6 is a schematic view showing the tin balls of the ball grid array seat according to the present invention.

(e) The tin glue 4 is melted so as to condense as balls or ball-like tin balls 4', so that condensed tin balls 4' are combined with the welding portions 21 at the lower ends of the terminals 2 of the ball grid array seat 1 (referring to FIGS. 5 and 6).

Figure 9:
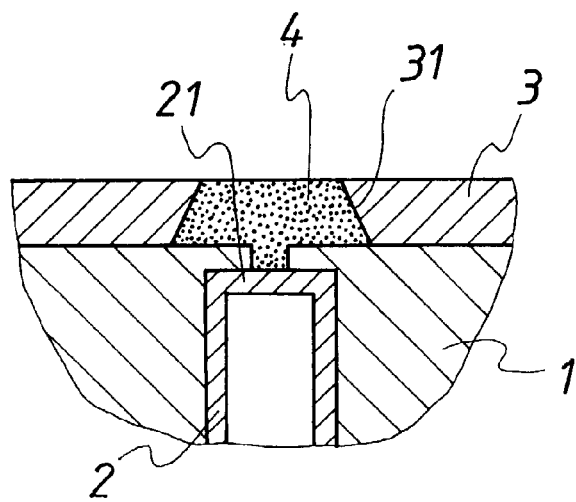
FIG. 9 is a schematic view includes the welding portions of the present invention is embedded.
Figure 10:
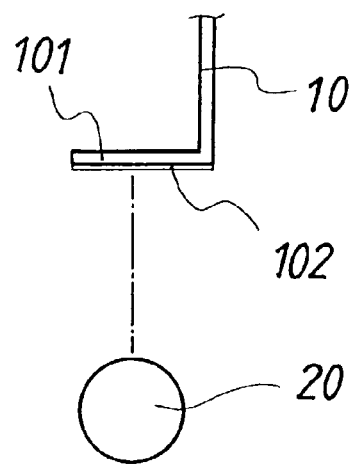
FIG. 10 is a schematic view showing that the welding assisting agent is coated upon a terminal.
Figure 11:
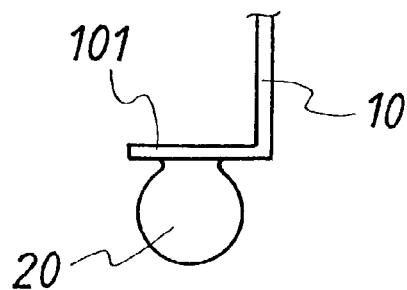
FIG. 11 is a schematic view showing a prior art tin ball being welded to a terminal.
Figure 12:
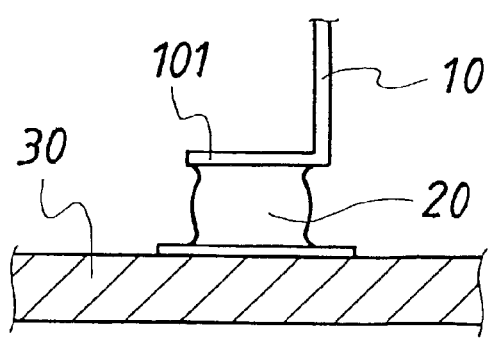
FIG. 12 is a schematic view showing that in the prior art, a terminal is welded to a circuit board.

By the above said connector and IC tin balls fixing manufacturing method, the welding portions 21 at bottoms of the connectors or IC or other electronic elements are welded with tin balls 4 so as to weld a circuit board. Since in the present invention, the tin glue 4 encloses the welding portions 21 at the lower end of the terminals 2 of the ball grid array seat 1 and despite the fact that the shape of the welding portions 21 includes plane shapes, piece shapes, needles and embedding shapes, etc. (referring to FIG. 9), the tin glue 4 can enclose the welding portions 21 such that hot melting may be used to cause the tin balls 4 to melt and then be condensed as tin balls 4'.

By the method of the present invention, a plurality of welding portions 21 can be used in one producing line. Thereby, the present invention provides a low cost manufacturing method with a high quality. The defects in the prior art are avoided.

By the method of the present invention that the tin film 3 is melted as tin liquid to enclose the welding portions 21 at the lower end of the terminal 2 of the ball grid array seat 1 of an electric connector, IC or electric elements, the way for fixing tin balls is not confined. By the present invention, the terminal 2 and ball grid array seat 1 may be a preferred combining way.

In the present invention, the electric connector and IC tin ball fixing manufacturing method, the tin balls are respectively melted upon the terminals 2 of the ball grid array seat 1. However, other methods can be used rather than the above said method of using a mold plate 3. The method can be applied to the ball grid array seat 1 of the connector 1 or IC. The method of this alternative embodiment comprises the following steps.

Figure 7:
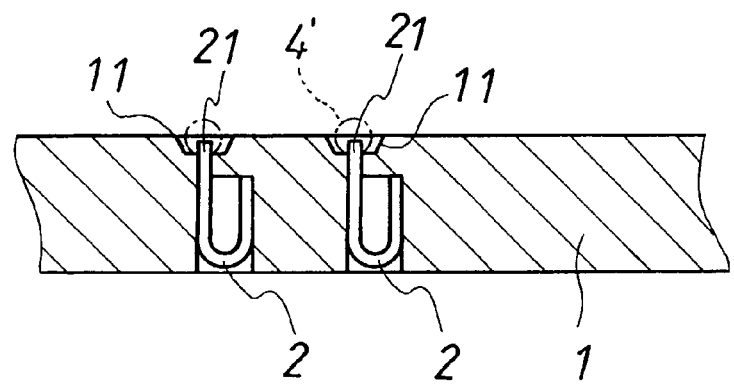
FIG. 7 is a schematic view showing another embodiment about the manufacturing method of the present invention.

(a) Select a ball grid array seat 1, in which the interior of the ball grid array seat 1 has been embedded with terminals 2 and the bottom thereof has a terminal welding portion 21. The ball grid array seat 1 has a plurality of recesses 11 around the ball grid array seat 1 (referring to FIG. 7), and each recess 31 can be formed with piece-like welding portions 21 (referring to FIG. 8).

(b) The tin glue 4 is filled into the recesses 11 so that the tin glue 4 exactly encloses the welding portions 21 of the terminals 2; the tin glue 4 is coated upon the recesses 11, or the tin glue 4 is extruded into the recesses 11; or the tin glue 4 is injected into the recesses 11 of the mold plate 3.

Figure 8:
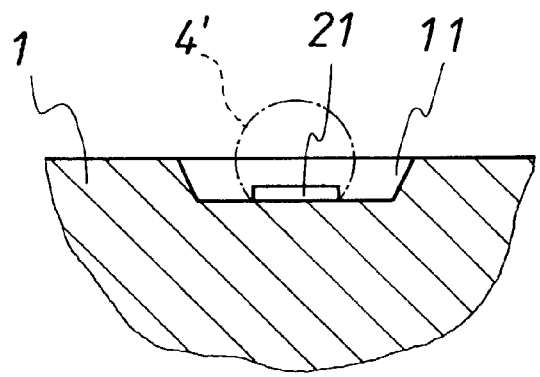
FIG. 8 is a schematic view showing another embodiment in the manufacturing method of the present invention.

(e) The tin glue 4 is melted so as to condense as balls or ball-like tin balls 4', so that condensed tin balls 4' are combined with the welding portions 21 at the lower ends of the terminals 2 of the ball grid array seat 1 (referring to FIG. 8).

In above manufacturing method, the tin glue 4 can enclose the welding portions 21 of the terminals 2 of the ball grid array seat 1 of a connector or IC. Thereby, any form of the welding portion 21 can be used in the present invention.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for fixing tin balls in one of a connector or an IC device to respective welding portions of terminals of an electric connector, IC or other electronic element so that the terminals can be welded to the tin balls of the ball grid array seat; the method comprising the steps of:
   (a) selecting a ball grid array seat including internal embedded terminals, a bottom of each terminal having a terminal welding portion;
   (b) covering a bottom of the ball grid array seat by a mold plate having a plurality of recesses aligned with welding portions of the terminals;
   (c) filling the tin glue into the recesses of the mold plate so that the tin glue exactly encloses the welding portions of the terminals;
   (d) taking out the mold plate so that the tin glue is left in the welding portions of the terminals; and
   (e) melting the tin glue so as to condense the tin glue into tin balls, the condensed tin balls being combined with the welding portions at the lower ends of the terminals of the ball grid array seat.

2. The manufacturing method for fixing tin balls in one of a connector or an IC device as claimed in claim 1, wherein the tin glue is coated upon the recesses of the mold plate.

3. The manufacturing method for fixing tin balls in one of a connector or an IC device as claimed in claim 1, wherein the tin glue is extruded into the recesses of the mold plate.

4. The manufacturing method for fixing tin balls in one of a connector or an IC device as claimed in claim 1, wherein the tin glue is injected into the recesses of the mold plate.

* * * * *